United States Patent
Uchida et al.

(10) Patent No.: US 11,004,822 B2
(45) Date of Patent: May 11, 2021

(54) WIRE CLAMP APPARATUS CALIBRATION METHOD AND WIRE BONDING APPARATUS

(71) Applicant: SHINKAWA LTD., Tokyo (JP)

(72) Inventors: Yohei Uchida, Tokyo (JP); Naoya Taira, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 261 days.

(21) Appl. No.: 16/327,340

(22) PCT Filed: Aug. 23, 2017

(86) PCT No.: PCT/JP2017/030051
§ 371 (c)(1),
(2) Date: May 28, 2019

(87) PCT Pub. No.: WO2018/038135
PCT Pub. Date: Mar. 1, 2018

(65) Prior Publication Data
US 2019/0279957 A1  Sep. 12, 2019

(30) Foreign Application Priority Data
Aug. 23, 2016 (JP) .............................. JP2016-162891

(51) Int. Cl.
*B23K 20/00* (2006.01)
*H01L 23/00* (2006.01)
(Continued)

(52) U.S. Cl.
CPC ............ *H01L 24/78* (2013.01); *B23K 20/004* (2013.01); *H01L 41/083* (2013.01); *H01L 41/09* (2013.01);
(Continued)

(58) Field of Classification Search
CPC ........ H01L 24/78; H01L 41/09; H01L 41/083; H01L 2224/78621; H01L 2224/78301;
(Continued)

(56) References Cited

U.S. PATENT DOCUMENTS 5,314,175 A * 5/1994 Izumi ........................ B25B 5/06
228/4.5
5,323,948 A   6/1994 Yamazaki et al.
(Continued)

FOREIGN PATENT DOCUMENTS

JP      57159034 A  * 10/1982  ............. H01L 24/78
JP      61101042 A  *  5/1986  ............. H01L 24/78
(Continued)

OTHER PUBLICATIONS

"International Search Report (Form PCT/ISA/210) of PCT/JP2017/030051," dated Sep. 26, 2017, with English translation thereof, pp. 1-4.

*Primary Examiner* — Kiley S Stoner
(74) *Attorney, Agent, or Firm* — JCIPRNET

(57) ABSTRACT

This wire clamp apparatus calibration method comprises: a step for driving a driving piezoelectric element by applying a predetermined frequency that causes a pair of arm portions to vibrate in an opening/closing direction; a step for detecting whether or not end portions of the pair of arm portions collide with each other on the basis of an output current outputted from the driving piezoelectric element when the pair of arm portions are vibrating in the opening/closing direction; a step for calculating, on the basis of the detection result, reference voltages in a state where the pair of arm portions are closed; and a step for performing calibration of a drive voltage to be applied to the driving piezoelectric element on the basis of the reference voltages. Accordingly, accuracy improvement and stabilization in an opening/

(Continued)

closing operation of the wire clamp apparatus can be achieved.

20 Claims, 10 Drawing Sheets

(51) Int. Cl.
    *H01R 4/28*     (2006.01)
    *H01L 41/09*     (2006.01)
    *H01L 41/083*     (2006.01)

(52) U.S. Cl.
    CPC .......... *H01R 4/28* (2013.01); *H01L 2224/786* (2013.01); *H01L 2224/78301* (2013.01); *H01L 2224/78621* (2013.01); *H01L 2224/851* (2013.01)

(58) Field of Classification Search
    CPC ......... H01L 2224/786; H01L 2224/851; H01L 2224/789; H01L 2224/78349; H01L 2924/00014; H01L 2224/45015; H01L 2224/78901; H01L 24/42; H01L 24/85; H01L 41/22; H01R 4/28; B23K 20/004; B23K 20/005; B23K 20/007
    USPC ..... 228/4.5, 180.5, 212–213, 102–103, 8–12
    See application file for complete search history.

(56) References Cited

U.S. PATENT DOCUMENTS

| | | |
|---|---|---|
| 5,388,751 A | 2/1995 | Harada et al. |
| 5,435,477 A | 7/1995 | Torihata et al. |
| 5,897,049 A | 4/1999 | Nakamura et al. |
| 5,979,737 A * | 11/1999 | Farassat ............... B23K 20/106 228/1.1 |
| 9,899,348 B2 | 2/2018 | Sekine |
| 2001/0004991 A1 * | 6/2001 | Mochida ................. H01L 24/78 228/103 |
| 2007/0187138 A1 * | 8/2007 | Takahashi ............... H01L 24/85 174/257 |
| 2008/0302857 A1 * | 12/2008 | Felber ............... H01L 21/67138 228/47.1 |
| 2009/0200357 A1 * | 8/2009 | Lee ......... H01L 24/78 228/44.7 |
| 2015/0128405 A1 * | 5/2015 | Zhang ..................... H01L 24/74 29/559 |
| 2015/0243627 A1 * | 8/2015 | Akiyama ................ H01L 24/78 228/102 |
| 2015/0246411 A1 * | 9/2015 | Sekine ................. B23K 20/007 228/102 |
| 2015/0249063 A1 * | 9/2015 | Sekine ................... H01L 24/85 438/617 |

FOREIGN PATENT DOCUMENTS

| | | | | |
|---|---|---|---|---|
| JP | S63111634 | | 5/1988 | |
| JP | 01245532 A | * | 9/1989 | ............ H01L 24/78 |
| JP | 02068942 A | * | 3/1990 | ............ H01L 24/78 |
| JP | 02130844 A | * | 5/1990 | ............ H01L 24/78 |
| JP | 05259213 A | * | 10/1993 | .......... B23K 20/004 |
| JP | H05259213 | | 10/1993 | |
| JP | 06260523 A | * | 9/1994 | ............ H01L 24/78 |
| JP | 06260524 A | * | 9/1994 | ............ H01L 24/78 |
| JP | H06260523 | | 9/1994 | |
| JP | H06260524 | | 9/1994 | |
| JP | 09082745 A | * | 3/1997 | ............... B25B 9/00 |
| JP | H09162228 | | 6/1997 | |
| JP | 09223711 A | * | 8/1997 | .......... B23K 20/025 |
| JP | 3005783 | | 2/2000 | |
| JP | 3005784 | | 2/2000 | |
| JP | 4842354 | | 12/2011 | |
| WO | 2015122410 | | 8/2015 | |

* cited by examiner

WIRE CLAMP APPARATUS CALIBRATION METHOD AND WIRE BONDING APPARATUS

CROSS-REFERENCE TO RELATED APPLICATION

This application is a 371 application of the international PCT application serial no. PCT/JP2017/030051, filed on Aug. 23, 2017, which claims the priority benefit of Japan application no. 2016-162891, filed on Aug. 23, 2016. The entirety of each of the above-mentioned patent applications is hereby incorporated by reference herein and made a part of this specification.

BACKGROUND

Technical Field

The disclosure relates to a wire clamp apparatus calibration method and a wire bonding apparatus.

Description of Related Art

In a wire bonding apparatus that electrically connects a pad of a semiconductor die to a lead of a package, a wire clamp apparatus is provided above a bonding tool for inserting the wire. For example, Patent Documents 1 to 3 disclose a wire clamp apparatus including a pair of arm portions having front end portions for clamping a wire; and a driving portion provided with a piezoelectric element that causes the pair of arm portions to open and close. According to the wire clamp apparatus, the distance between the front end portions of the pair of arm portions is controlled based on the voltage value applied to the piezoelectric element. Based on this control, the wire can be constrained by closing the arm portions or can be released by opening the arm portions.

PRIOR ART DOCUMENT

Patent Document

Patent Document 1: Japanese Patent No. 3005783
Patent Document 2: Japanese Patent No. 3005784
Patent Document 3: Japanese Patent No. 4842354

SUMMARY

Technical Problem

However, conventionally, it has been difficult to accurately grasp the opening amount of the arm portions with respect to the driving voltage for driving the piezoelectric element. In particular, the wire clamp apparatus may cause an absolute value of the opening amount of the arm portions to vary due to various factors such as a change in time or a temperature change of components such as the piezoelectric element or a torque difference when mounted to the main body of the wire bonding apparatus. If there is a variation in the opening amount of the arm portions, the wire cannot be constrained or released with high accuracy and stability in some cases. Therefore, it is important to eliminate the problem for improving the reliability of wire bonding.

The disclosure has been made in view of such circumstances, and an object thereof is to achieve accuracy improvement and stabilization in an opening/closing operation of the wire clamp apparatus.

Solution to the Problem

A calibration method of a wire clamp apparatus according to an aspect of the disclosure includes: a step of preparing a wire clamp apparatus including a pair of arm portions and a driving portion, the pair of arm portions having front end portions for clamping a wire and extending from the front end portions toward base end portions, the driving portion being combined to the base end portions of the pair of arm portions and being provided with a driving piezoelectric element which causes the front end portions of the pair of arm portions to open and close by a driving voltage; a driving step of applying a predetermined frequency that causes the pair of arm portions to vibrate in an opening/closing direction to drive the driving piezoelectric element; a detection step of detecting whether the front end portions of the pair of arm portions have collided based on an output current outputted from the driving piezoelectric element when the pair of arm portions are vibrating in the opening/closing direction; a step of calculating a reference voltage in a closed state of the pair of arm portions based on a detection result in the detection step; and a calibration step of calibrating the driving voltage applied to the driving piezoelectric element based on the reference voltage.

According to the above configuration, a predetermined frequency is applied to drive the driving piezoelectric element, and it is detected whether the front end portions of the pair of arm portions have collided with each other based on the output current of the driving piezoelectric element when the pair of arm portions are vibrating in the opening/closing direction, and the reference voltage is calculated based on the detection result to perform calibration. In this way, the opening amount of the pair of arm portions can be easily and accurately adjusted, so that the accuracy improvement and stabilization in the opening/closing operation of the wire clamp apparatus can be achieved. Therefore, accurate and stable wire bonding can be performed.

In the above method, the detection step may include detecting an intensity of a vibration frequency when the front end portions of the pair of arm portions have collided by performing a Fourier transform on the output current.

In the above method, the step of calculating the reference voltage may include calculating at least one of a first reference voltage and a second reference voltage, wherein the first reference voltage indicates a closed state when the pair of arm portions have completed closing, and the second reference voltage indicates a closed state when the pair of arm portions start to open.

In the above method, the detection step may include detecting whether the front end portions of the pair of arm portions have collided with the wire in a state where the wire is interposed between the front end portions of the pair of arm portions.

In the above method, a step of calculating an opening amount of the pair of arm portions based on the detection result in the state where the wire is interposed between the front end portions of the pair of arm portions may be included, and in the calibration step, the driving voltage applied to the driving piezoelectric element may be calibrated based on the opening amount of the pair of arm portions.

In the above method, the driving step may include applying a resonance frequency to the pair of arm portions.

A wire bonding apparatus according to another aspect of the disclosure includes: a wire clamp apparatus including a pair of arm portions and a driving portion, the pair of arm portions having front end portions for clamping a wire and extending from the front end portions toward base end portions, the driving portion being combined to the base end portions of the pair of arm portions and being provided with a driving piezoelectric element which causes the front end portions of the pair of arm portions to open and close by a driving voltage; a driving voltage supply part for applying a predetermined frequency that causes the pair of arm portions to vibrate in an opening/closing direction to drive the driving piezoelectric element; a collision detection part for detecting whether the front end portions of the pair of arm portions have collided based on an output current outputted from the driving piezoelectric element when the pair of arm portions are vibrating in the opening/closing direction; a voltage calculation part for calculating a reference voltage in a closed state of the pair of arm portions based on a detection result of the collision detection part; and a voltage calibration part for calibrating the driving voltage applied to the driving piezoelectric element based on the reference voltage.

According to the above configuration, a predetermined frequency is applied to drive the driving piezoelectric element, and it is detected whether the front end portions of the pair of arm portions have collided with each other based on the output current of the driving piezoelectric element when the pair of arm portions are vibrating in the opening/closing direction, and the reference voltage is calculated based on the detection result to perform calibration. In this way, the opening amount of the pair of arm portions can be easily and accurately adjusted, so that the accuracy improvement and stabilization in the opening/closing operation of the wire clamp apparatus can be achieved. Therefore, accurate and stable wire bonding can be performed.

In the above apparatus, the collision detection part may detect an intensity of a vibration frequency when the front end portions of the pair of arm portions have collided by performing a Fourier transform on the output current.

In the above apparatus, the voltage calculation part calculates at least one of a first reference voltage and a second reference voltage, wherein the first reference voltage indicates a closed state when the pair of arm portions have completed closing, and the second reference voltage indicates a closed state when the pair of arm portions start to open.

In the above apparatus, the collision detection part may detect whether the front end portions of the pair of arm portions have collided with the wire in a state where the wire is interposed between the front end portions of the pair of arm portions.

In the above apparatus, the voltage calculation part may calculate an opening amount of the pair of arm portions based on the detection result by the collision detection part of the state where the wire is interposed between the front end portions of the pair of arm portions, and the voltage calibration part may calibrate the driving voltage applied to the driving piezoelectric element based on the opening amount of the pair of arm portions.

In the above apparatus, the driving voltage supply part may apply a resonance frequency to the pair of arm portions.

Effects

According to the disclosure, accuracy improvement and stabilization in an opening/closing operation of the wire clamp apparatus can be achieved.

DESCRIPTION OF THE EMBODIMENTS

Embodiments of the disclosure will be described below. In the following description of the drawings, the same or similar components are denoted by the same or similar symbols. The drawings are exemplary and schematically indicate the size or shape of each part, and the technical scope of the disclosure shall not be construed to be limited to the embodiments.

Figure 1:
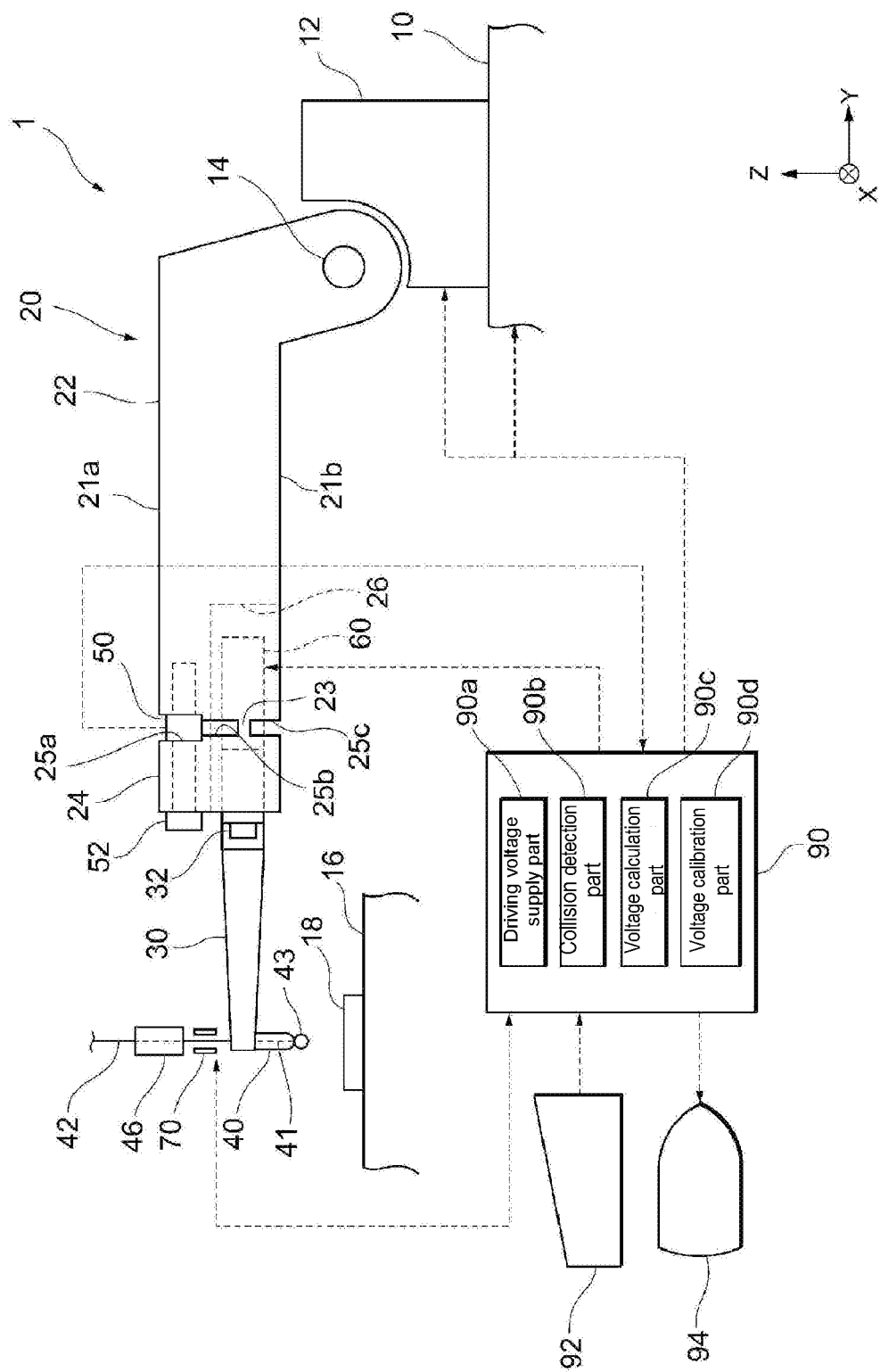
FIG. 1 is a view showing an overall outline of a wire bonding apparatus according to an embodiment of the disclosure.
Figure 2A:
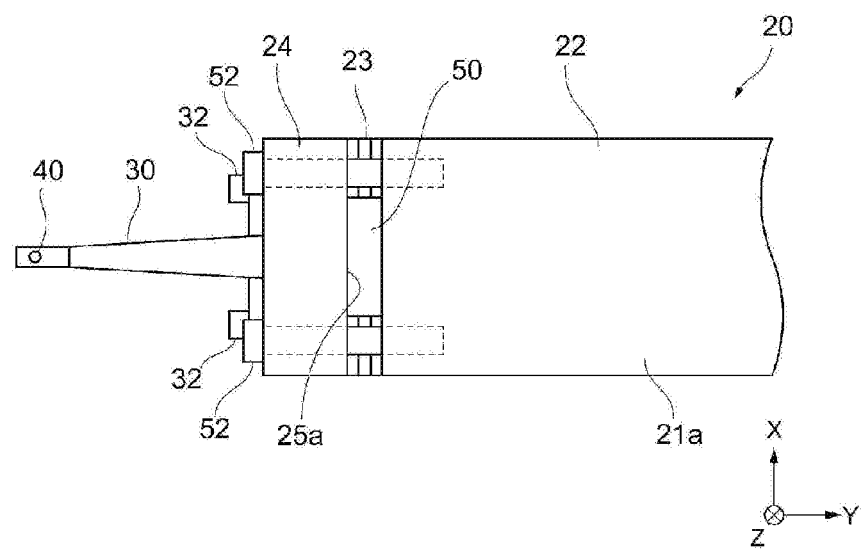
FIGS. 2A and 2B are a top view and a bottom view of a bonding arm in the wire bonding apparatus of FIG. 1.
Figure 2B:
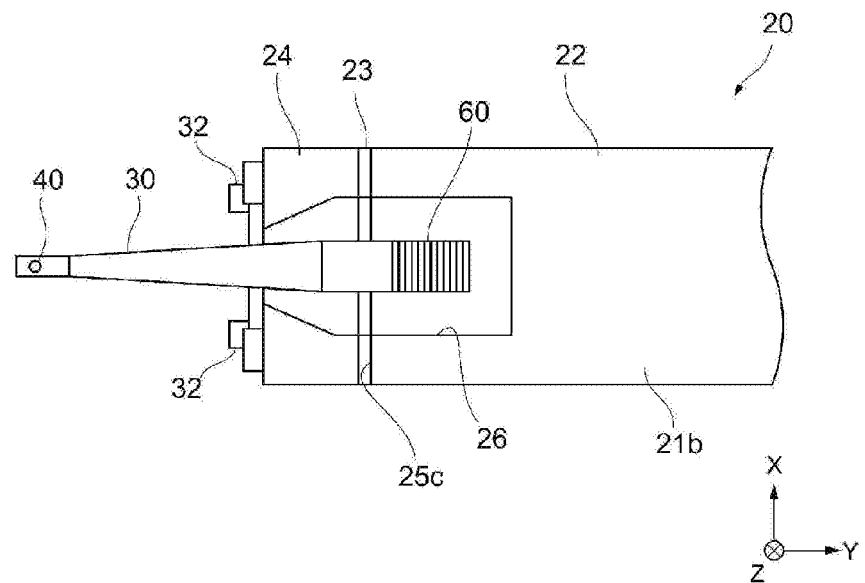
Figure 3:
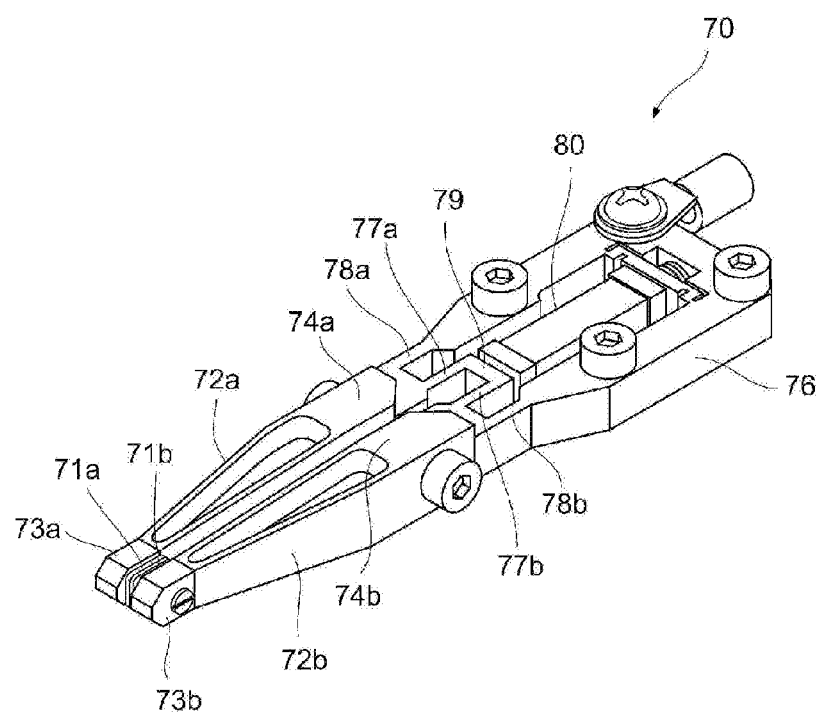
FIG. 3 is a perspective view of the wire clamp apparatus of FIG. 1.

FIG. 1 is a view showing an overall outline of a wire bonding apparatus of the embodiment. In addition, FIGS. 2A and 2B are partial enlarged views of a bonding arm in the wire bonding apparatus, and FIG. 2A is a top view of the bonding arm, and FIG. 2B is a bottom view of the bonding arm. FIG. 3 is a perspective view of the wire clamp apparatus of FIG. 1.

As shown in FIG. 1, a wire bonding apparatus 1 includes an XY driving mechanism 10, a Z driving mechanism 12, a bonding arm 20, an ultrasonic horn 30, a bonding tool 40, a load sensor 50, an ultrasonic vibrator 60, a wire clamp apparatus 70, and a wire bonding control part 90.

The XY drive mechanism 10 is configured to be slidable in the XY-axis direction (a direction parallel to a bonding surface), and a Z driving mechanism (linear motor) 12 that allows the bonding arm 20 to swing in the Z-axis direction (a direction perpendicular to the bonding surface) is provided on the XY driving mechanism (linear motor) 10.

The bonding arm 20 is supported by a support shaft 14 and is configured to be swingable with respect to the XY driving mechanism 10. The bonding arm 20 is formed in a substantially rectangular parallelepiped shape by extending from the XY driving mechanism 10 to a bonding stage 16 on which a workpiece (such as a semiconductor die or a substrate) 18 being a bonding target is placed. The support shaft 14 is located, for example, at substantially the same height as a work surface (the bonding surface) of the workpiece 18. The bonding arm 20 includes an arm base end portion 22 mounted to the XY driving mechanism 10; an arm front end portion 24 located on the front end side of the arm base end portion 22 and mounted with the ultrasonic horn 30; and a connecting portion 23 which connects the arm base end portion 22 and the arm front end portion 24 and has flexibility. The connecting portion 23 is configured by slits 25a, 25b and 25c, wherein the slits 25a and 25b have a predetermined width and extend from a top surface 21a of the bonding arm 20 toward a bottom surface 21b of the bonding arm 20, and the slit 25c has a predetermined width and extends from the bottom surface 21b of the bonding arm 20 toward the top surface 21a of the bonding arm 20. In this way, since the connecting portion 23 is configured by the slits 25a, 25b and 25c partially as a thin wall part, the arm front end portion 24 is configured to be bent with respect to the arm base end portion 22.

As shown in FIGS. 1 and 2B, a concave portion 26 for receiving the ultrasonic horn 30 is formed on the side of the bottom surface 21b of the bonding arm 20. The ultrasonic horn 30 is mounted on the arm front end portion 24 by a horn fixing screw 32 in a state of being received in the concave portion 26 of the bonding arm 20. The ultrasonic horn 30 holds the bonding tool 40 at a front end portion that protrudes from the concave portion 26, and the ultrasonic vibrator 60 that generates ultrasonic vibration is provided in the concave portion 26. Ultrasonic vibration is generated by the ultrasonic vibrator 60, and the ultrasonic vibration is transmitted to the bonding tool 40 by the ultrasonic horn 30, so that ultrasonic vibration can be imparted to the bonding target via the bonding tool 40. The ultrasonic vibrator 60 is, for example, a piezoelectric vibrator.

Further, as shown in FIGS. 1 and 2A, the slits 25a and 25b are formed on the side of the top surface 21a of the bonding arm 20 sequentially from the top surface 21a toward the bottom surface 21b. The upper slit 25a is formed to have a width wider than that of the lower slit 25b. Further, the load sensor 50 is provided in the upper slit 25a formed to have a wider width. The load sensor 50 is fixed to the arm front end portion 24 by a preloading screw 52. The load sensor 50 is disposed so as to be sandwiched between the arm base end portion 22 and the arm front end portion 24. In other words, the load sensor 50 is mounted with offset from the central axis of the longitudinal direction of the ultrasonic horn 30 with respect to the contact/separation direction of the bonding target and is mounted between the rotation center of the bonding arm 20 and the mounting surface of the ultrasonic horn 30 in the arm front end portion 24 (i.e., the front end surface of the arm front end portion 24 on the side of the bonding tool 40). Further, as described above, since the ultrasonic horn 30 holding the bonding tool 40 is mounted to the arm front end portion 24, when a load is applied to the front end of the bonding tool 40 by the reaction force from the bonding target, the arm front end portion 24 bends with respect to the arm base end portion 22, so that the load can be detected in the load sensor 50. The load sensor 50 is, for example, a piezoelectric element load sensor.

The bonding tool 40 is for inserting a wire 42 and is, for example, a capillary provided with an insertion hole 41. In this case, it is configured that the wire 42 used for bonding is inserted into the insertion hole 41 of the bonding tool 40 and that a portion of the wire 42 may extrude from the front end of the bonding tool 40. Further, a pressing portion for pressing the wire 42 is provided at the front end of the bonding tool 40. The pressing portion has a shape that is rotationally symmetrical about the axial direction of the insertion hole 41 of the bonding tool 40 and has a pressing surface on the lower surface around the insertion hole 41.

The bonding tool 40 is mounted to the ultrasonic horn 30 in a way replaceable by elastic force or the like. Further, the wire clamp apparatus 70 is provided above the bonding tool 40, and the wire clamp apparatus 70 is configured to restrain or release the wire 42 at a predetermined timing. A wire tensioner 46 is provided further above the wire clamp apparatus 70, and the wire tensioner 46 is configured to allow the wire 42 to be inserted and to provide an appropriate tension to the wire 42 being bonded.

The material of the wire 42 is appropriately selected based on the easiness of processing, low electric resistance, and the like, and for example, gold (Au), copper (Cu), silver (Ag) or the like is used. Further, the wire 42 is a first bonding point where a free air ball 43 extending from the front end of the bonding tool 40 is bonded to the workpiece 18.

Here, the wire clamp apparatus 70 of the embodiment is described in detail with reference to FIG. 3. The wire clamp apparatus 70 includes a pair of arm portions 72a and 72b and a driving portion 76 mounted to the main body of the wire bonding apparatus 1. The pair of arm portions 72a and 72b have front end portions 73a and 73b and base end portions 74a and 74b for clamping the wire 42, and the pair of arm portions 72a and 72b extend from the front end portions 73a and 73b toward the base end portions 74a and 74b in a direction substantially orthogonal to the direction of the wire axis. Clamping pieces 71a and 71b which the wire 42 contacts are provided on mutually opposing surfaces of the front end portions 73a and 73b. Further, the driving portion 76 is provided with a driving piezoelectric element 80 that causes the front end portions 73a and 73b of the pair of arm portions 72a and 72b to open and close. The driving piezoelectric element 80 controls the opening/closing operation of the pair of arm portions 72a and 72b by supplying a driving voltage from the wire bonding control part 90 (specifically, a driving voltage supply part 90a). An end portion of the driving portion 76 opposite to the pair of arm portions 72a and 72b is fixed to the main body of the wire bonding apparatus 1. In addition, in FIG. 1, the wire clamp apparatus 70 shows a state where the extending direction of the pair of arm portions 72a and 72b is viewed from the side of the front end portions 73a and 73b.

The pair of arm portions 72a and 72b are connected to the driving portion 76 via a plurality of connecting portions 77a, 77b, 78a and 78b at the base end portions 74a and 74b of the pair of arm portions 72a and 72b. Specifically, when the pair of arm portions 72a and 72b are viewed from above the wire axis direction, the pair of connecting portions 78a and 78b are provided on two outer sides of the pair of arm portions 72a and 72b, and the pair of connecting portions 77a and 77b are provided to be interposed between the pair of connecting portions 78a and 78b. The connecting portions are configured as elastically deformable thin neck portions. Further, the pair of connecting portions 77a and 77b are connected to each other via an acting portion 79. In such a configuration, the driving piezoelectric element 80 is provided in a state where both end portions of the driving piezoelectric element 80 are fixed between the driving portion 76 and the acting portion 79. The driving piezoelectric element 80 extends and contracts along the extending direction of the pair of arm portions 72a and 72b by applying the driving voltage, whereby each of the connecting portions 77a, 77b, 78a and 78b is elastically deformed to cause the front end portions 73a and 73b of the pair of arm portions 72a the 72b to open and close. Note that each of the connecting portions 77a, 77b, 78a and 78b has elasticity in a closing direction of the front end portions 73a and 73b.

The driving piezoelectric element 80 is, for example, a laminated piezoelectric actuator with a plurality layers of piezoelectric elements laminated in a direction connecting the driving portion 76 and the acting portion 79.

The pair of arm portions 72a and 72b (the clamping pieces 71a and 71b, the front end portions 73a and 73b, and the base end portions 74a and 74b) is configured, for example, by a conductive material.

Next, the operation of the wire clamp apparatus 70 will be described. In a state where no voltage is applied to the driving piezoelectric element 80, the front end portions 73a and 73b of the pair of arm portions 72a and 72b are applied with a predetermined load in the closing direction. Further, when a driving voltage is applied to the driving piezoelectric element 80, the driving piezoelectric element 80 extends toward the extending direction of the pair of arm portions 72a and 72b (i.e., the direction connecting the driving portion 76 and the acting portion 79) by electrostrictive or magnetostrictive effect, whereby the acting portion 79 is moved toward the direction of the pair of arm portions 72a and 72b; in this way, the connecting portions 77a, 77b, 78a and 78b bend toward an outer direction, and the front end portions 73a and 73b are in an open state. The movement amount of the front end portions 73a and 73b (i.e., the opening amount of the arm portions) at this time corresponds to the extension amount of the driving piezoelectric element 80 magnified based on the ratio of the length from the acting portion 79 to the connecting portions to the length from the connecting portions to the front end portions 73a and 73b.

In more detail, when the driving voltage applied to the driving piezoelectric element 80 increases from the state of zero, the wire clamping load of the front end portions 73a and 73b decreases in proportion to the voltage value applied to the driving piezoelectric element 80, and when the voltage value reaches a reference voltage value, the clamping pieces 71a and 71b of the front end portions 73a and 73b are in a state of contacting each other (the closed state) in the state where the wire clamping load is zero. When the voltage value is further increased, the front end portions 73a and 73b are in a state of opening in a direction away from each other.

The wire bonding apparatus 1 of the embodiment is described in more detail with reference back to FIG. 1. The wire bonding control portion 90 is connected among structures such as the XY driving mechanism 10, the Z driving mechanism 12, the ultrasonic horn 30 (the ultrasonic vibrator 60), the load sensor 50, and the wire clamp apparatus 70 in a way capable of transmitting and receiving signals, and the operations of these structures are controlled by the wire bonding control portion 90, whereby the necessary processes for wire bonding can be performed.

Further, the wire bonding control portion 90 is connected with an operation part 92 for inputting control information and a display part 94 for outputting the control information. In this way, an operator can input the necessary control information with the operation part 92 while recognizing the screen with the display part 94. Note that the wire bonding control part 90 is a computer device including a CPU, a memory, and the like. The memory stores in advance a bonding program for performing the necessary processes for wire bonding, various data processed by each component in the wire bonding control part 90 (to be described later) and the like. The wire bonding control part 90 is configured to control necessary operations when performing calibration of a wire clamp apparatus to be described later (such as including a program for causing a computer to perform each operation).

The wire bonding control part 90 of the embodiment includes a driving voltage supply part 90a, a collision detection part 90b, a voltage calculation part 90c, and a voltage calibration part 90d.

The driving voltage supply part 90a supplies a driving voltage to the driving piezoelectric element 80. Specifically, the driving voltage supply part 90a supplies a DC voltage to the driving piezoelectric element 80 as a driving voltage in the wire bonding process and supplies a pulse current applied with a predetermined frequency (including the DC component and the AC component) to the driving piezoelectric element 80 as the driving voltage in the calibration process of the wire clamp apparatus 70. By supplying a pulse current to the driving piezoelectric element 80, the front end portions 73a and 73b of the pair of arm portions 72a and 72b are applied with a load in a direction opposite to the wire clamping load (the opening direction) by the DC component, and the front end portions 73a and 73b of the pair of arm portions 72a and 72b are vibrated in the opening/closing direction by the AC component of the pulse current. Here, the predetermined frequency as the AC component of the pulse current is, for example, a resonance frequency fr determined based on the natural angular vibration frequency of the pair of arm portions 72a and 72b. In the embodiment, the driving voltage supply part 90a applies the resonance frequency fr (or a frequency in the vicinity of fr) to the driving piezoelectric element 80.

The collision detection part 90b detects the output current from the driving piezoelectric element 80 when the pair of arm portions 72a and 72b are vibrating in the opening/closing direction by the driving piezoelectric element 80 being driven by the driving voltage supply part 90a, and the collision detection part 90b detects whether the pair of arm portions 72a and 72b have collided based on the detected output current. Specifically, the driving voltage supply part 90a causes the input value of the DC component or the AC component of pulse current to change, and the collision detection part 90b detects whether the pair of arm portions 72a and 72b have collided for each input value.

The collision detection part 90b can analyze the output current of the driving piezoelectric element 80 by using, for example, Fourier transform and thereby can detect whether the clamping pieces 71a and 71b of the front end portions 73a and 73b of the pair of arm portions 72a and 72b have collided with each other. When the pair of arm portions 72a and 72b vibrate in the opening/closing direction, a potential difference is generated in the driving piezoelectric element 80. Further, when the pair of arm portions 72a and 72b collide with each other, the potential difference obtained from the driving piezoelectric element 80 is largely changed. Therefore, in the embodiment, it is detected whether the pair of arm portions 72a and 72b have collided based on the change in the potential difference of the driving piezoelectric element 80. The data related to the output current detected by the collision detection part 90b are stored in the memory of the wire bonding control part 90.

The voltage calculation part 90c reads the data related to the output current detected by the collision detection part 90b from the memory and calculates the reference voltage of the closed state of the pair of arm portions 72a and 72b based on the data related to the output current. Here, the reference voltage in the closed state of the pair of arm portions 72a and 72b refers to a DC voltage corresponding to a state (load zero point) where the pair of arm portions 72a and 72b contact each other in a state where the wire clamping load is substantially zero. The reference voltage may be, for example, a first reference voltage indicating the closed state when the pair of arm portions 72a and 72b have completed closing or a second reference voltage indicating the closed state when the pair of arm portions 72a and 72b start to open. At least one of the first and second reference voltages is calculated by the voltage calculation part 90c. Further, in addition to the reference voltage, the voltage calculation part 90c calculates the opening amount of the pair of arm portions 72a and 72b when the driving voltage is supplied based on the data related to the output current obtained by the collision detection part 90b. In addition, calculation examples of the reference voltage and the opening amount by the voltage calculation part 90c will be described later.

The data related to the reference voltage obtained by the voltage calculation part 90c are stored in the memory of the wire bonding control part 90.

The voltage calibration part 90d reads the data related to the reference voltage or the opening amount of the arm portions calculated by the voltage calculation part 90c from the memory and calibrates the driving voltage (DC voltage) applied to the driving piezoelectric element 80 in the wire bonding process based on the reference voltage or the opening amount of the arm portions. In this case, the voltage calibration part 90d may correct the value of the already set driving voltage or may newly set the driving voltage to be applied to the driving piezoelectric element 80. In this way, the driving voltage calibrated by the voltage calibration part 90d is stored in the memory of the wire bonding control part 90. Further, in the wire bonding process, the driving voltage supply part 90a can read the calibrated driving voltage stored in the memory and drive the driving piezoelectric element 80 based on the driving voltage.

Next, a calibration method of a wire clamp apparatus of the embodiment will be described with reference to FIGS. 4 to 12.

Figure 4:
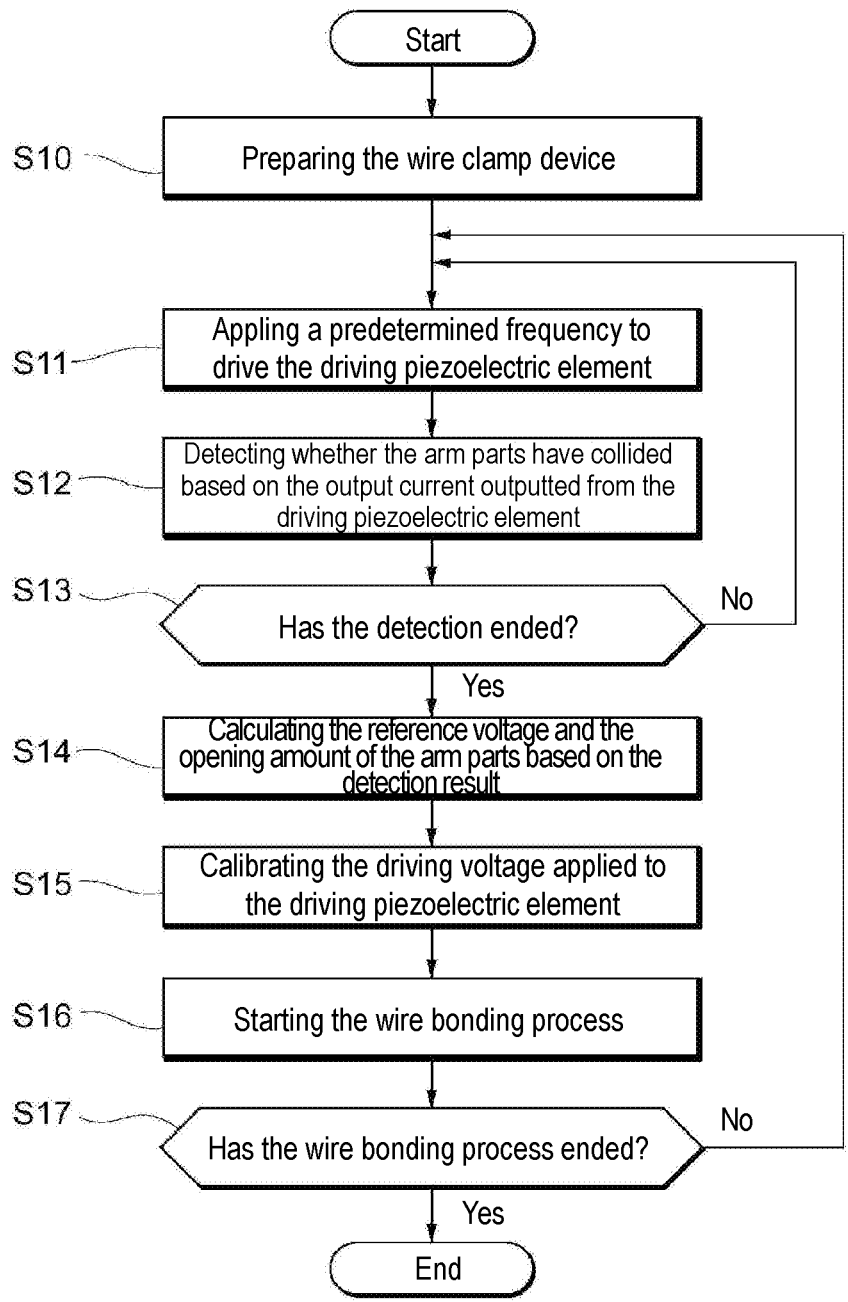
FIG. 4 is a flow chart showing a wire clamp apparatus calibration method according to an embodiment of the disclosure.
Figure 5:
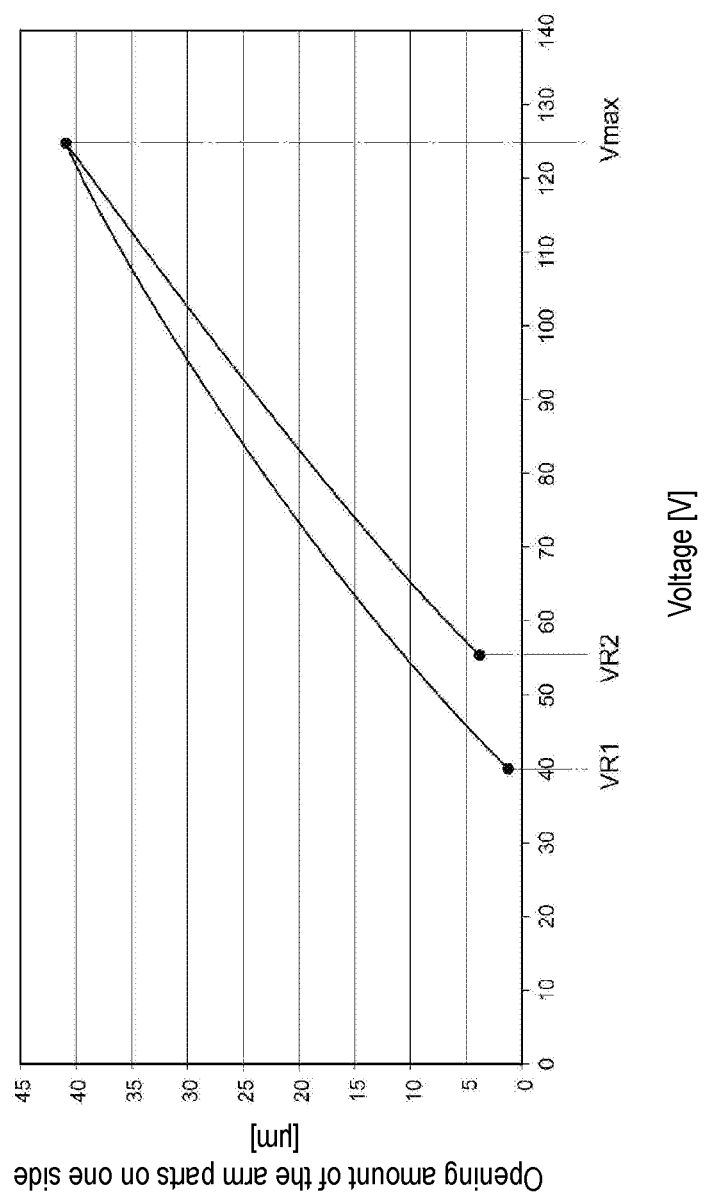
FIG. 5 shows the relationship between the driving voltage and the opening amount of the arm portions.
Figure 6:
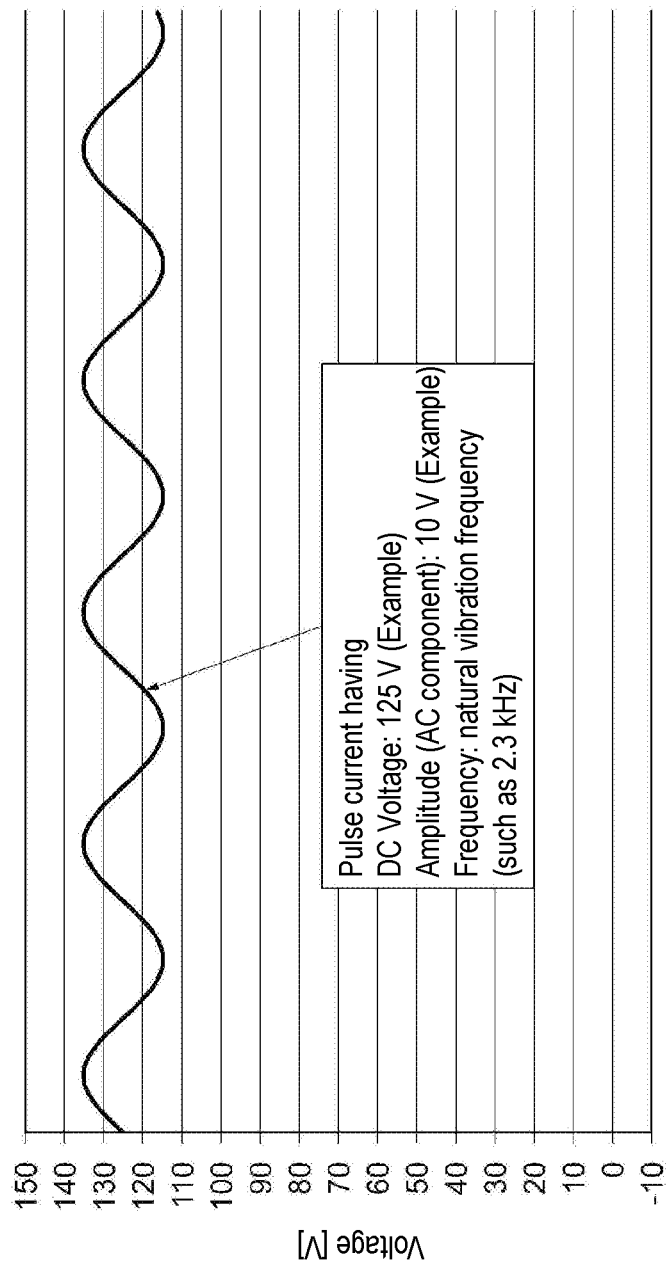
FIG. 6 shows an example of applying an input voltage to a driving piezoelectric element.
Figure 11:
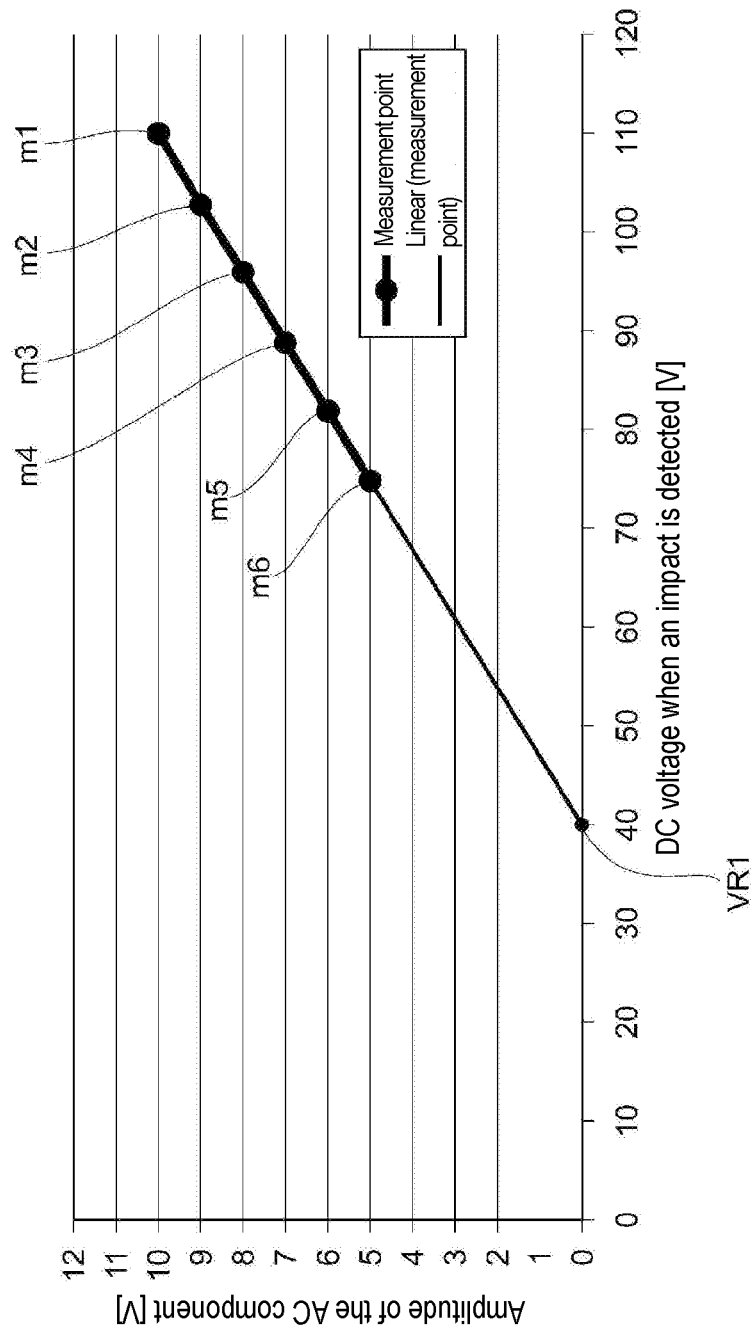
FIG. 11 shows an example of calculating a first reference voltage (VR1) indicating a closed state when the arm portions have completed closing.
Figure 12:
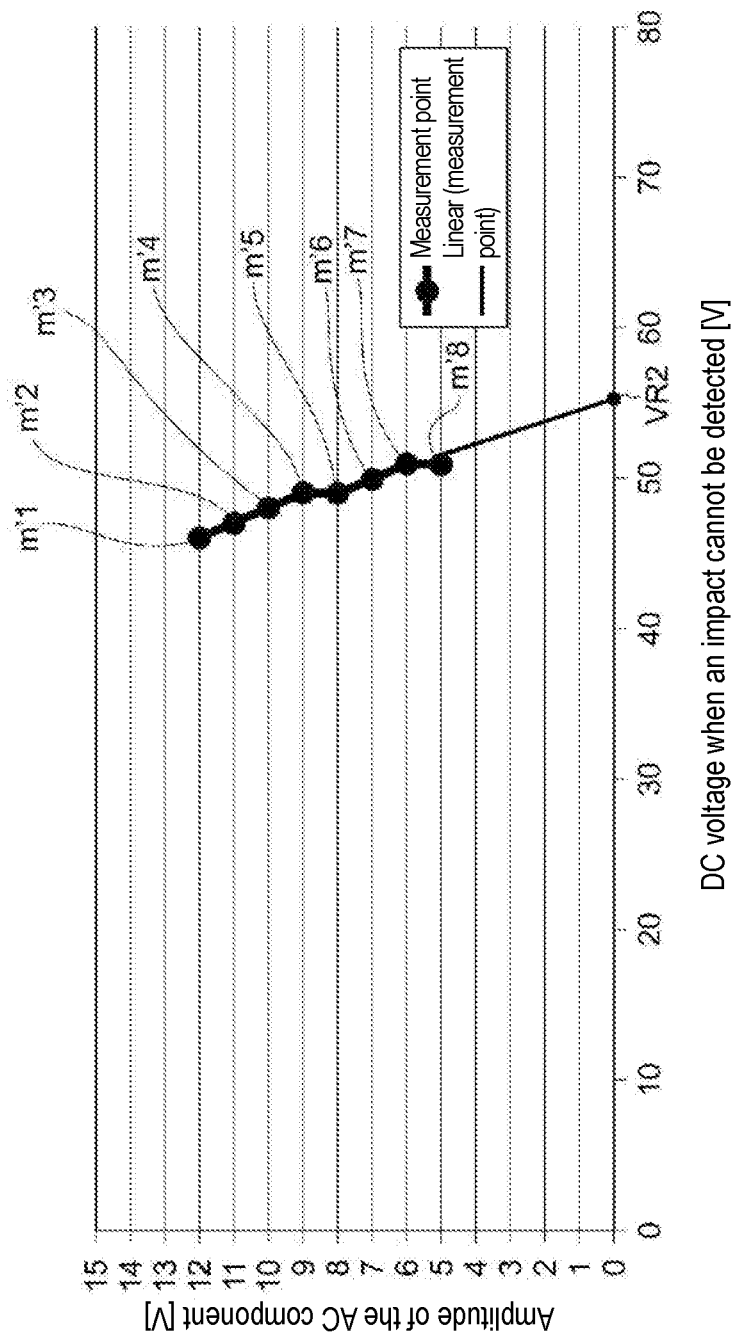
FIG. 12 shows an example of calculating a second reference voltage (VR2) indicating a closed state when the arm portions start to open.

Here, FIG. 4 is a flow chart showing the method. Moreover, FIG. 5 is a view showing the relationship between the driving voltage in the wire clamp apparatus 70 and the opening amount of the arm portions (hysteresis curve of the piezoelectric element). In addition, FIG. 6 is an example of an input voltage applied to the driving piezoelectric element, and FIGS. 7 to 10 show waveforms related to an output current of the driving piezoelectric element. FIGS. 11 and 12 respectively show examples of calculating a reference voltage which indicates the closed state of the arm portions.

The calibration method of the embodiment can be performed with the wire bonding apparatus 1. Further, the calibration method of the wire clamp apparatus of the embodiment can be performed when the wire bonding is completed (that is, before the start of the next wire bonding) or when the teaching for the wire bonding is performed or the like.

First, the wire clamp apparatus 70 is prepared (S10). Specifically, the wire clamp apparatus 70 is mounted on a bonding head and is thereby incorporated as a component of the wire bonding apparatus 1.

Next, the driving voltage supply part 90a applies a predetermined frequency to drive the driving piezoelectric element 80 so that the pair of arm portions 72a and 72b vibrate in the opening/closing direction (S11). That is, a pulse current is supplied to the driving piezoelectric element 80. In this way, the front end portions 73a and 73b of the pair of arm portions 72a and 72b are applied with a load in a direction opposite to the wire clamping load (the opening direction) by the DC component of the pulse current, and the front end portions 73a and 73b of the pair of arm portions 72a and 72b are vibrated in the opening/closing direction by the AC component of the pulse current. The predetermined frequency as the AC component is, for example, the resonance frequency fr of about 2.3 [kHz] but is not limited thereto. For example, when the resonance frequency is given and the pair of arm portions 72a and 72b excessively collide, a frequency in the vicinity of the resonance frequency which is intentionally offset from the resonance frequency may be applied.

Further, it is detected whether the pair of arm portions 72a and 72b have collided based on the output current outputted from the driving piezoelectric element 80 when the pair of arm portions 72a and 72b are vibrating in the opening/closing direction (S12). Then, if the detection has not ended (NO in S13), the process returns to the step S11 to change the input value of the DC component or the AC component of the pulse current, and in step S12, the collision detection part 90b detects whether the pair of arm portions 72a and 72b have collided for the changed input value. In this way, the driving step and the detection step are repeatedly performed; when it is determined that the detection has ended (YES in S13), the voltage calculation part 90c calculates the reference voltage in the closed state of the pair of arm portions 72a and 72b and the opening amount of the arm portions based on the detection result (S13).

Here, a specific example will be described for the processes of the steps S11 to S14. In the embodiment, in the steps S11 to S14, the first reference voltage VR1 indicating the closed state when the pair of arm portions 72a and 72b have completed closing, the second reference voltage VR2 indicating the closed state when the pair of arm portions 72a and 72b start to open, and the opening amount a of the pair of arm portions 72a and 72b when supplied with the driving voltage are calculated, respectively. Note that as shown in FIG. 5, VR1 and VR2 are voltage values different from each other in accordance with the piezoelectric characteristics of the driving piezoelectric element 80.

Example of Calculation of Reference Voltage VR1

First, the pulse current shown in FIG. 6 is supplied to the driving piezoelectric element 80 by the driving voltage supply part 90a. In the example shown in FIG. 6, it is a pulse current with a DC voltage of 125 V, an amplitude (the AC component) of 10 V, and a frequency of the natural vibration frequency (such as the resonance frequency fr of 2.3 kHz). By supplying such a pulse current, the front end portions 73a and 73b of the pair of arm portions 72a and 72b are applied with a load in a direction away from each other and vibrate in the opening/closing direction (S11).

Next, the collision detection part 90b detects the output current of the driving piezoelectric element 80 when the pair of arm portions 72a and 72b are vibrating in the opening/closing direction and detects whether the pair of arm portions 72a and 72b have collided based on the detected output current (S12).

Figure 7:
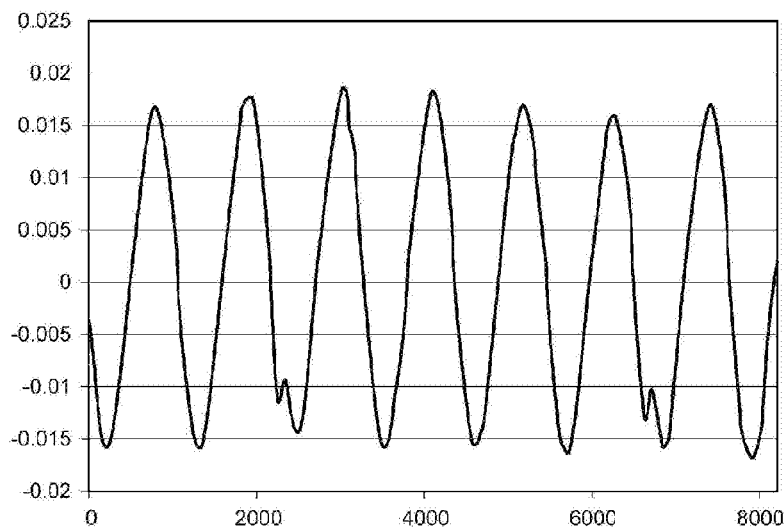
FIG. 7 is a view showing a waveform of an output current from the driving piezoelectric element when the front end portions of the arm portions do not collide.
Figure 8:
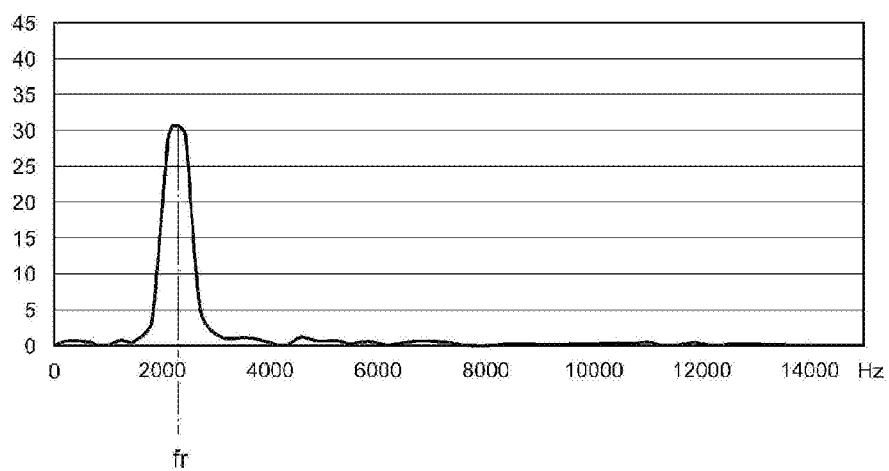
FIG. 8 is a view showing a waveform obtained by Fourier transforming the output current of FIG. 7.

When the pair of arm portions 72a and 72b have not collided, the waveform of the output current of the driving piezoelectric element 80 changes as shown in FIG. 7 and is subjected to Fast Fourier Transform (FFT) processing to obtain FIG. 8. As can be seen from FIG. 8, the intensity of the vibration frequency appears only as a first peak which is the resonance frequency fr (in the embodiment, fr=about 2.3 [kHz]). That is, according to the analysis result of FIG. 8, it is understood that the front end portions 73a and 73b of the pair of arm portions 72a and 72b have not collided.

Then, the process proceeds to the next detection step (NO in the step S13), and the input value (the input value of at least one of the DC component and the AC component) of the pulse current supplied to the driving piezoelectric element 80 is changed. The steps S11 and S12 are also performed for the changed input value.

Specifically, the resonance frequency fr and the amplitude of 10 V are maintained, and the DC voltage is decreased until it can be detected that the front end portions 73a and 73b of the pair of arm portions 72a and 72b have collided. In the example shown in FIG. 11, the DC voltage is decreased to 110 V.

Figure 9:
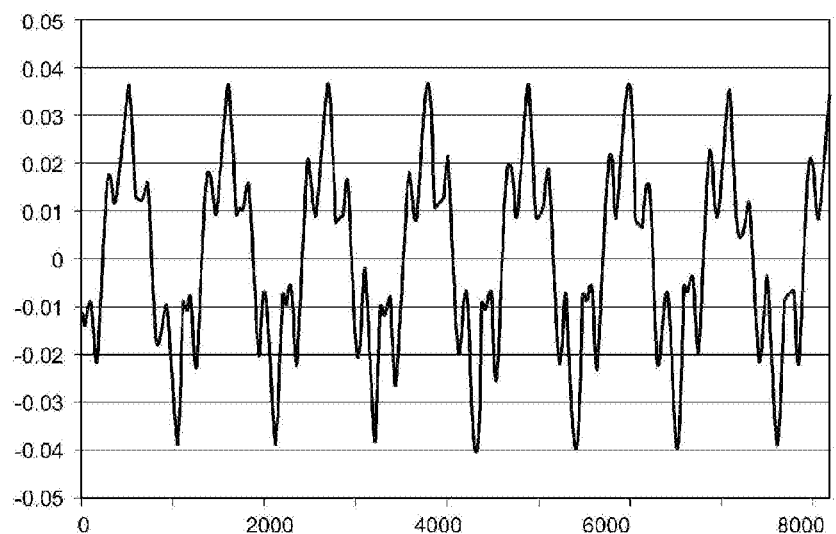
FIG. 9 is a view showing a waveform of an output current from the driving piezoelectric element when the front end portions of the arm portions have collided.
Figure 10:
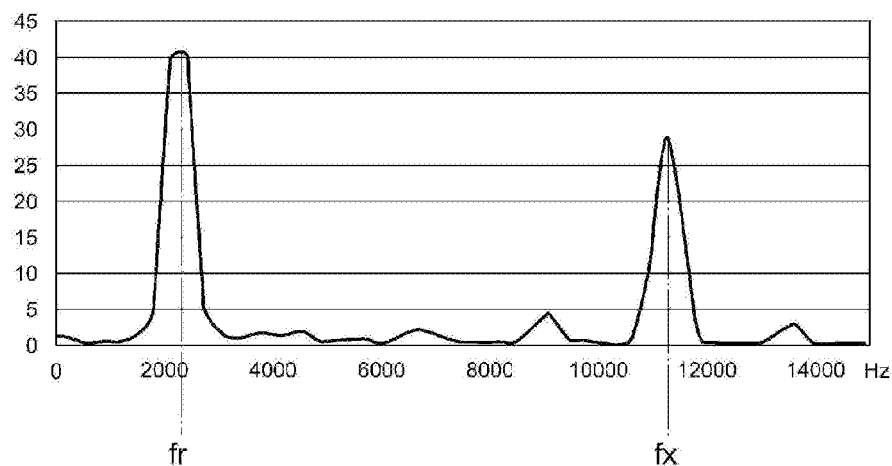
FIG. 10 is a view showing a waveform obtained by Fourier transforming the output current of FIG. 9.

Therefore, when the pair of arm portions 72a and 72b have collided, the waveform of the output current of the driving piezoelectric element 80 changes as shown in FIG. 9 and is subjected to FFT processing to obtain FIG. 10. As can be seen from FIG. 10, in addition to the first peak which is the resonance frequency fr (in this example, fr=about 2.3 [kHz]), the intensity of the vibration frequency also appears as a second peak (whose intensity is smaller than that of the first peak) which is a frequency fx different from the resonance frequency fr. That is, according to the analysis result of FIG. 10, it is understood that the front end portions 73a and 73b of the pair of arm portions 72a and 72b have collided.

In this way, as shown in FIG. 11, the collision detection part 90b obtains a first measurement point m1 (DC voltage: 110 V; amplitude: 10 V) where it is determined that the pair of arm portions 72a and 72b have collided. The data of the measurement point obtained by the collision detection part 90b are stored in the memory of the wire bonding control part 90.

Next, the input value of the AC component (amplitude) of the pulse current supplied to the driving piezoelectric element 80 is decreased to 9 V, and the DC voltage is further decreased until it can be detected that the front end portions 73a and 73b of the pair of arm portions 72a and 72b have collided. In the example shown in FIG. 11, the DC voltage is decreased to 103 V. In this way, as shown in FIG. 11, the collision detection part 90b obtains a second measurement point m2 (DC voltage: 103 V; amplitude: 9 V) where it is determined that the pair of arm portions 72a and 72b have collided.

In this way, the steps S11 to S13 are repeatedly performed, and the collision detection part 90b obtains two or more measurement points where it is determined that the pair of arm portions 72a and 72b have collided. In the example shown in FIG. 11, six measurement points m1 to m6 are obtained. Each of the measurement points m1 to m6 has a DC voltage (DC) and an amplitude (AC) as follows: m1 (DC 110 V, AC 10 V), m2 (103 V, AC 9 V), m3 (DC 96 V, AC 8 V), m4 (DC 89 V, AC 7 V), m5 (DC 82 V, AC 6 V) and m6 (DC 75 V, AC 5 V).

Thereafter, the collision detection is ended (YES in S13), and the first reference voltage VR1 with the amplitude of the AC component substantially equivalent to zero is calculated from the plurality of measurement points to be equal to about 40 V (S14). As shown in FIG. 5, the first reference voltage VR1 corresponds to a voltage value at which the opening amount of the arm portions is substantially close to zero in the curve that is passed when the driving voltage (DC voltage) is decreased from Vmax.

In addition, in each of the driving step and the detection step, the steps S11 and S12 can be performed simultaneously so that it is detected whether the arm portions have collided while the input value of the pulse current supplied to the driving piezoelectric element 80 is being changed.

In addition, the input/output data shown in FIGS. 6 to 10 in the steps S11 and S12 are stored in the memory of the wire bonding control part 90 and are displayed on the display part 94 in accordance with the operation of the operator.

Example of Calculation of Reference Voltage VR2

Similar to the reference voltage VR1, the reference voltage VR2 can calculated by repeatedly performing the steps S11 to S13. However, the calculation method of the reference voltage VR2 is different from that of the reference voltage VR1 in that a measurement point where it cannot be determined that the pair of arm portions 72a and 72b have collided is obtained.

Specifically, first, a pulse current with a DC voltage of 75 V, an amplitude (the AC component) of 5 V, and a frequency of the natural vibration frequency (such as the resonance frequency fr of 2.3 kHz) is supplied to the driving piezoelectric element 80 by the driving voltage supply part 90a (S11). Next, the collision detection part 90b detects the output current of the driving piezoelectric element 80 when the pair of arm portions 72a and 72b are vibrating in the opening/closing direction and detects whether the pair of arm portions 72a and 72b have collided based on the detected output current (S12).

As also shown in FIG. 11 (with reference to the measurement point m6), at the above input value of the pulse current, the pair of arm portions 72a and 72b collide, so that the outputs as described in FIGS. 9 and 10 are obtained.

Then, the process proceeds to the next detection step (NO in the step S13); the resonance frequency fr and the amplitude of 5 V are maintained, and the DC voltage is decreased until it can be detected that the front end portions 73a and 73b of the pair of arm portions 72a and 72b have stopped colliding. In the example shown in FIG. 12, the DC voltage is decreased to 51 V.

In this way, when the pair of arm portions 72a and 72b have stopped colliding, the output waveforms are changed to those of FIGS. 7 and 8. In this way, as shown in FIG. 12, the collision detection part 90b obtains a first measurement point m'1 (DC voltage: 51 V; amplitude: 5 V) where it is determined that the pair of arm portions 72a and 72b have stopped colliding.

Next, the input value of the AC component (amplitude) of the pulse current supplied to the driving piezoelectric element 80 is increased to 6 V, and the DC voltage is further decreased until it can be detected that the front end portions 73a and 73b of the pair of arm portions 72a and 72b have stopped colliding. In the example shown in FIG. 12, at the amplitude of 6 V, the front end portions 73a and 73b of the pair of arm portions 72a and 72b still do not collide, and a second measurement point m'2 is obtained (DC voltage: 51 V; amplitude: 6 V). Then, the input value of the amplitude is further increased to 7 V, and as shown in FIG. 12, the collision detection part 90b obtains a third measurement point m'3 (DC voltage: 50 V; amplitude: 7 V) where it is determined that the pair of arm portions 72a and 72b have stopped colliding.

In this way, the steps S11 to S13 are repeatedly performed, and the collision detection part 90b obtains two or more measurement points where it is determined that the pair of arm portions 72a and 72b have stopped colliding. In the example shown in FIG. 12, eight measurement points m'1 to m'8 are obtained. Each of the measurement points m'1 to m'8 has a DC voltage (DC) and an amplitude (AC) as follows: m'1 (DC 51 V, AC 5 V), m'2 (DC 51 V, AC 6 V), m'3 (DC 50 V, AC 7 V), m'4 (DC 49 V, AC 8 V), m'5 (DC 49 V, AC 9 V), m'6 (DC 48 V, AC 10 V), m'7 (DC 47 V, AC 11 V) and m'8 (DC 46 V, AC 12 V).

Thereafter, the collision detection is ended (YES in S13), and the second reference voltage VR2 with the amplitude of the AC component substantially equivalent to zero is calculated from the plurality of measurement points to be equal to about 54 V (S14). As shown in FIG. 5, the second reference voltage VR2 corresponds to a voltage value at which the opening amount of the arm portions is substantially close to zero in the curve that is passed when the driving voltage (DC voltage) is increased from zero. Note that the reference voltages VR1 and VR2 have a relationship of VR1<VR2.

Example of Calculation of Opening Amount a of Arm Portions

The opening amount a of the arm portions can be calculated by performing the steps S11 and S12 in a state where the wire 42 is interposed between the front end portions 73a and 73b of the pair of arm portions 72a and 72b to detect whether the front end portions 73a and 73b of the pair of arm portions 72a and 72b have collided with the wire 42. Here, the opening amount a of the arm portions is the movement amount of the front end portions 73a and 73b of the pair of arm portions 72a and 72b per unit voltage.

Specifically, first, in step S11, for example, in a state where the wire 42 having a wire diameter p of about 20 m is interposed between the front end portions 73a and 73b of the pair of arm portions 72a and 72b, a pulse current with a DC voltage of 125 V, an amplitude (the AC component) of 8 V, and a frequency of the natural vibration frequency (such as the resonance frequency fr of 2.3 kHz) is supplied to the driving piezoelectric element 80. Next, in the step S12, the collision detection part 90b detects whether the pair of arm portions 72a and 72b have collided (S12). Further, when the pair of arm portions 72a and 72b have not collided, the DC voltage of the pulse current supplied to the driving piezoelectric element 80 is decreased until the collision detection part 90b can detect that the pair of arm portions 72a and 72b have collided. In this way, for example, in the case where the DC voltage of the pulse current at which the pair of arm portions 72a and 72b can be detected to have collided is 120 V, the collision detection part 90b obtains a measurement point m"1 (DC voltage: 120 V; amplitude: 8 V) where it is determined that the pair of arm portions 72a and 72b have collided, and the data of the measurement point are stored in the memory of the wire bonding control part 90.

In addition, the measurement point m"1 is compared with any one of the measurement points (such as m1 to m6 or m'1 to m'8) obtained during the calculation of the reference voltages VR1 and VR2, and the opening amount a of the arm portions is calculated based on the comparison result (S14). In one example, the measurement point m"1 is compared with the measurement point m3 (DC voltage: 96 V; amplitude: 8 V) having the same amplitude.

Here, when the wire diameter is set to φ (=20 μm), and the difference of the DC voltage of the measurement point m"1 and the DC voltage of the measurement point m3 is set to ΔV (=24 V), then the opening amount a of the arm portions has a relation of α=φ/ΔV. In an example of the embodiment, a is about 0.83.

In this way, characteristics related to the opening/closing operation of the pair of arm portions 72a and 72b in the wire clamp apparatus 70 can be obtained. The characteristics are stored in the memory of the wire bonding control part 90 and may be displayed on the display part 94 in accordance with the operation of the operator.

With reference back to FIG. 4, thereafter, the driving voltage applied to the driving piezoelectric element 80 is calibrated (S15). In the embodiment, the driving voltage is calibrated by the voltage calibration part 90d based on the reference voltages VR1 and VR2 and the opening amount a of the arm portions. Thereafter, the wire bonding process is started using the calibrated wire clamp apparatus 70 (S16). According to the embodiment, the opening/closing operation (the opening amount) of the pair of arm portions 72a and 72b of the wire clamp apparatus 70 corresponding to the driving voltage can be accurately grasped; therefore, the wire bonding process with high accuracy and stability can be performed.

Thereafter, it is determined whether the wire bonding has ended (S17), and if the wire bonding has not ended and is further continued (NO in S17), the process returns to the step S11. In contrast, if the wire bonding has ended (YES in S17), the method ends. Note that each of the steps S11 to S17 is preferably performed, for example, whenever the type of the wire bonding process is different, such as in a case where the wire bonding having different wire diameters is performed, or in a case where the wire bonding having different temperature environments is performed. In this way, the calibration can be performed based on the opening amount of the wire clamp apparatus 70 corresponding to various situations and is thus particularly effective.

As described above, according to the embodiment, a predetermined frequency is applied to drive the driving piezoelectric element 80, and it is detected whether the front end portions of the pair of arm portions 72a and 72b have collided with each other based on the output current outputted from the driving piezoelectric element 80 when the pair of arm portions 72a and 72b are vibrating in the opening/closing direction, and the reference voltages are calculated based on the detection result to perform calibration. In this way, the opening amount of the pair of arm portions 72a and 72b can be easily and accurately adjusted, so that the accuracy improvement and stabilization in the opening/closing operation of the wire clamp apparatus 70 can be achieved. Therefore, accurate and stable wire bonding can be performed.

In addition, according to the embodiment, since the driving piezoelectric element 80 may be used both to drive and to calibrate the wire clamp apparatus 70, compared with, for example, a conventional configuration using a laser displacement meter or the like, the driving voltage can be calibrated with a simple configuration.

The disclosure is not limited to the above embodiments, and various modifications may be applied.

In the above embodiments, an aspect of directly detecting the output current of the driving piezoelectric element has been described. However, in order to detect the output current of the driving piezoelectric element, other sensors such as other piezoelectric elements for detection may be used.

Further, in the above embodiments, an aspect in which the output current is subjected to the FFT processing to analyze whether the pair of arm portions have collided has been described. However, the disclosure is not necessarily limited to the aspect performing the FFT processing and may analyze the output current without performing the FFT processing or may perform analysis with other processing than the FFT.

Further, in the above embodiments, an example in which the reference voltages VR1 and VR2 and the opening amount a are sequentially obtained has been described. However, the order of obtaining the reference voltages is not limited thereto, and the order and the like may be changed as appropriate. Further, when the reference voltages VR1 and VR2 are calculated, it is also possible to detect whether the front end portions 73a and 73b of the pair of arm portions 72a and 72b have collided with each other, or when the reference voltages VR1 and VR2 are calculated, it is also possible to detect whether the front end portions 73a and 73b of the pair of arm portions 72a and 72b have collided with the wire in a state where the wire is interposed therebetween.

In the disclosure, the relationship between the direction of the driving voltage of the driving piezoelectric element and the direction of opening/closing operation of the arm portions is not limited to the examples of the embodiments; for example, a driving voltage in the negative direction may be applied to the driving piezoelectric element so that the pair of arm portions are moved in a direction in which they are opened to each other.

In addition, in the disclosure, the components of the wire clamp apparatus are not limited to the above embodiments and are not particularly limited as long as the opening/closing operation of the arm portions can be performed by driving the driving piezoelectric element.

The aspects described in the embodiments of the disclosure may be appropriately combined according to the purpose or may be used with change or modification. The disclosure is not limited to the description of the embodiments. It is to be understood that such combinations or changes or modifications are also included in the technical scope of the disclosure.

DESCRIPTION OF REFERENCE NUMERALS

1: Wire bonding apparatus
70: Wire clamp apparatus
72a, 72b: Arm portion
73a, 73b: Front end portion
74a, 74b: Base end portion
76: Driving portion
90: Wire bonding control part
90a: Driving voltage supply part
90b: Collision detection part
90c: Voltage calculation part
90d: Voltage calibration part

What is claimed is:

1. A calibration method of a wire clamp apparatus, comprising:
   a step of preparing a wire clamp apparatus comprising a pair of arm portions and a driving portion, the pair of arm portions having front end portions for clamping a wire and extending from the front end portions toward base end portions, the driving portion being combined to the base end portions of the pair of arm portions and being provided with a driving piezoelectric element which causes the front end portions of the pair of arm portions to open and close by a driving voltage;
   a driving step of applying a predetermined frequency that causes the pair of arm portions to vibrate in an opening/closing direction to drive the driving piezoelectric element;
   a detection step of detecting whether the front end portions of the pair of arm portions have collided based on an output current outputted from the driving piezoelectric element when the pair of arm portions are vibrating in the opening/closing direction;
   a step of calculating a reference voltage in a closed state of the pair of arm portions based on a detection result in the detection step; and
   a calibration step of calibrating the driving voltage applied to the driving piezoelectric element based on the reference voltage.

2. The calibration method according to claim 1, wherein the detection step comprises detecting an intensity of a vibration frequency when the front end portions of the pair of arm portions have collided by performing a Fourier transform on the output current.

3. The calibration method according to claim 1, wherein the step of calculating the reference voltage comprises calculating at least one of a first reference voltage and a second reference voltage, wherein the first reference voltage indicates a closed state when the pair of arm portions have completed closing, and the second reference voltage indicates a closed state when the pair of arm portions start to open.

4. The calibration method according to claim 1, wherein the detection step comprises detecting whether the front end portions of the pair of arm portions have collided with the wire in a state where the wire is interposed between the front end portions of the pair of arm portions.

5. The calibration method according to claim 4, further comprising:
   a step of calculating an opening amount of the pair of arm portions based on the detection result in the state where the wire is interposed between the front end portions of the pair of arm portions,
   in the calibration step, calibrating the driving voltage applied to the driving piezoelectric element based on the opening amount of the pair of arm portions.

6. The calibration method according to claim 1, wherein the driving step comprises applying a resonance frequency to the pair of arm portions.

7. A wire bonding apparatus, comprising:
   a wire clamp apparatus comprising a pair of arm portions and a driving portion, the pair of arm portions having front end portions for clamping a wire and extending from the front end portions toward base end portions, the driving portion being combined to the base end portions of the pair of arm portions and being provided with a driving piezoelectric element which causes the front end portions of the pair of arm portions to open and close by a driving voltage;
   a driving voltage supply part for applying a predetermined frequency that causes the pair of arm portions to vibrate in an opening/closing direction to drive the driving piezoelectric element;
   a collision detection part for detecting whether the front end portions of the pair of arm portions have collided based on an output current outputted from the driving piezoelectric element when the pair of arm portions are vibrating in the opening/closing direction;
   a voltage calculation part for calculating a reference voltage in a closed state of the pair of arm portions based on a detection result of the collision detection part; and
   a voltage calibration part for calibrating the driving voltage applied to the driving piezoelectric element based on the reference voltage.

8. The wire bonding apparatus according to claim 7, wherein the collision detection part detects an intensity of a vibration frequency when the front end portions of the pair of arm portions have collided by performing a Fourier transform on the output current.

9. The wire bonding apparatus according to claim 7, wherein the voltage calculation part calculates at least one of a first reference voltage and a second reference voltage, wherein the first reference voltage indicates a closed state when the pair of arm portions have completed closing, and the second reference voltage indicates a closed state when the pair of arm portions start to open.

10. The wire bonding apparatus according to claim 7, wherein the collision detection part detects whether the front end portions of the pair of arm portions have collided with the wire in a state where the wire is interposed between the front end portions of the pair of arm portions.

11. The wire bonding apparatus according to claim 10, wherein
the voltage calculation part calculates an opening amount of the pair of arm portions based on the detection result by the collision detection part of the state where the wire is interposed between the front end portions of the pair of arm portions, and
the voltage calibration part calibrates the driving voltage applied to the driving piezoelectric element based on the opening amount of the pair of arm portions.

12. The wire bonding apparatus according to claim 7, wherein the driving voltage supply part applies a resonance frequency to the pair of arm portions.

13. The calibration method according to claim 2, wherein the driving step comprises applying a resonance frequency to the pair of arm portions.

14. The calibration method according to claim 3, wherein the driving step comprises applying a resonance frequency to the pair of arm portions.

15. The calibration method according to claim 4, wherein the driving step comprises applying a resonance frequency to the pair of arm portions.

16. The calibration method according to claim 5, wherein the driving step comprises applying a resonance frequency to the pair of arm portions.

17. The wire bonding apparatus according to claim 8, wherein the driving voltage supply part applies a resonance frequency to the pair of arm portions.

18. The wire bonding apparatus according to claim 9, wherein the driving voltage supply part applies a resonance frequency to the pair of arm portions.

19. The wire bonding apparatus according to claim 10, wherein the driving voltage supply part applies a resonance frequency to the pair of arm portions.

20. The wire bonding apparatus according to claim 11, wherein the driving voltage supply part applies a resonance frequency to the pair of arm portions.

* * * * *